United States Patent
Fitch (10) Patent No.: US 7,461,449 B2
(45) Date of Patent: Dec. 9, 2008

(54) APPARATUS FOR RECLAMATION OF PRECIOUS METALS FROM CIRCUIT BOARD SCRAP

(76) Inventor: Michael K. Fitch, 1509 Alto Rd., Kokomo, IN (US) 46902

( * ) Notice: Subject to any disclaimer, the term of this patent is extended or adjusted under 35 U.S.C. 154(b) by 340 days.

(21) Appl. No.: 11/256,846

(22) Filed: Oct. 24, 2005

(65) Prior Publication Data
US 2006/0037889 A1  Feb. 23, 2006

Related U.S. Application Data (62) Division of application No. 10/719,506, filed on Nov. 21, 2003, now Pat. No. 6,986,192.

(51) Int. Cl.
B23P 19/00 (2006.01)
B23P 19/04 (2006.01)

(52) U.S. Cl. .............. 29/762; 29/403.3; 29/403.4; 29/890.03; 241/20; 241/23; 204/157.15

(58) Field of Classification Search ............ 29/17.2, 29/403.1, 403.2, 403.3, 403.4, 426.1, 426.2, 29/762, 791, 890.03, 890.038; 241/20, 23, 241/24.13, 24.14, 24.25, DIG. 38; 209/162; 204/155, 157.15; 373/138, 150, 140, 152; 165/DIG. 228
See application file for complete search history.

(56) References Cited

U.S. PATENT DOCUMENTS

| | | | |
|---|---|---|---|
| 3,539,693 A * | 11/1970 | Elischer | 373/150 |
| 3,885,744 A | 5/1975 | Drage | |
| 3,905,556 A | 9/1975 | Drage | |
| 4,301,320 A * | 11/1981 | Hochstrasser et al. | 373/165 |
| 5,139,203 A | 8/1992 | Alavi | |
| 5,217,171 A | 6/1993 | Feldman | |
| 5,630,554 A | 5/1997 | Izumikawa | |
| 5,662,579 A | 9/1997 | Bickford | |
| 5,676,318 A | 10/1997 | Yokoyama | |
| 5,843,287 A | 12/1998 | Wicks | |
| 5,887,805 A | 3/1999 | Chapman | |
| 5,979,033 A | 11/1999 | Chang | |
| 6,143,139 A | 11/2000 | Wicks | |

OTHER PUBLICATIONS

Ronald Rosenson, Refining & smelting precious metals from PC Boards, Conf. paper NEPCON West—1994.

* cited by examiner

Primary Examiner—Jermie E Cozart
(74) Attorney, Agent, or Firm—Frank D. Lachenmaier (57) ABSTRACT

The present invention springs from the discovery that mild acids could be utilized to shear undesired metals away from desired precious metals that have been plated onto circuit board runners or contacts. This shearing action occurs at a high rate when metal scrap segments are immersed in mild acid and excited by application of an electromagnetic field at specific frequencies and power levels. These frequencies and power levels are based on the end metal desired and the metals contained in the scrap and the acid utilized. When mild acid saturated with copper sulfate and loaded with scrap metals is subjected to an electromagnetic field at the appropriate frequency and power levels, copper and nickel molecules are sheared rapidly and absorbed into solution, leaving only the desired metal, such as gold, in a 99.5% pure flake which can be skimmed off the surface of the solution or filtered from the solution. The captured metal flake is then rinsed in water and denatured alcohol, compressed, melted and poured into bars or nuggets for further use or sale.

2 Claims, 6 Drawing Sheets

APPARATUS FOR RECLAMATION OF PRECIOUS METALS FROM CIRCUIT BOARD SCRAP

CROSS-REFERENCE TO RELATED APPLICATION

This application claims the benefit of Provisional Patent Application Ser. No. 60/430,326 filed Dec. 2, 2002 and Restricted Utility Patent Application 10,719,506 filed Nov. 21, 2003 now U.S. Pat. No. 6,986,192.

FEDERALLY SPONSORED RESEARCH

Not Applicable

SEQUENCE LISTING OR PROGRAM

Not Applicable

BACKGROUND

1. Field of Invention

This invention generally relates to reclamation of precious metals from circuit board scrap. More specifically this invention relates to dramatic improvements to the state of the art reclamation systems resulting from the breakthrough discovery that much more benign chemicals can be used for separation of unwanted metals, leaving only desired metal, when combined wanted and unwanted scrap metals are immersed in chemical baths that are subjected to an electromagnetic field at specific frequencies and power levels during processing.

2. Prior Art

The prior art discloses several different systems for recovery of precious metals from circuit board scrap all of which require a multitude of processing steps and equipment.

The first commonly used system is a complex dry process which involves pulverizing, crushing metals-containing scrap circuit boards into a fine powder, magnetic separation, electrostatic separation, air table separation and gravimetric separation. These systems are time consuming, capital intensive, require large machines, lots of floor space, dust collection systems, are labor intensive and only prepare the metal alloyed powders for further wet chemical and/or electrolytic separation. These systems are disclosed in Drage (U.S. Pat. No. 3,885,744), Drage (U.S. Pat. No. 3,905,556), Alavi (U.S. Pat. No. 5,139,203), Feldman (U.S. Pat. No. 5,217,171), Izumikawa (U.S. Pat. No. 5,630,554), Yokoyama (U.S. Pat. No. 5,676,318), and Chapman (U.S. Pat. No. 5,887,805).

The second major system for precious metals reclamation from printed circuit boards involves a system where the circuit boards are pyrolized in a closed loop system consisting of a scrubber, bag house and incinerator. These systems are disclosed in Bickford (U.S. Pat. No. 5,662,579), Wicks (U.S. Pat. No. 5,843,287), Chang (U.S. Pat. No. 5,979,033), and Wicks (U.S. Pat. No. 6,143,139). The incinerated product is placed into a crucible furnace with the proper fluxing agents and reduced to metal and cast into unrefined bars. The unrefined bars are placed into a blast furnace to remove all deleterious components and subjected to further refining steps in systems such as those requiring wet chemicals and/or electrolysis for final separation.

The wet chemical stripping systems utilize strong hydrochloric, sulphuric and nitric acids and a caustic soda solution and/or electrolytic systems involving casting the alloyed metals into anodes and placing them in galvanic baths depending on the particular metal being reduced or stripped. All the above drawbacks are involved in these systems plus an additional hazard to control when dibenzo-p-dioxins and dibenzofurans are given off when the scrap is incinerated with a halogen flame. This system can require a four month long process with many steps and pieces of equipment.

Behr Precious Metals, Inc. discloses, in a conference paper presented at NEPCON West—1994 entitled *Refining and smelting of precious metals from printed circuit Boards*, the third system, involving wet chemistry processes which subject surface plated boards and or parts to a cyanide stripping action in an agitated tumbler that allows the precious metals to be placed in solution, reclaimed from solution, refined and melted into bars. Environmental concerns may rule out this system in the future.

All of the above systems suffer from the following disadvantages:

(a) They all, with the exception of the cyanide stripping of surface plating, begin with the associated non-metal boards crushed into powder along with the metals or pyrolized with associated separation problems, expense and hazards.

(b) Once the metal fractions have been separated out from the non-metals then a slow wet chemistry and/or electrolytic process is required with multiple steps and baths utilizing very strong acids and bases to separate the various metals, casting into anodes and subjecting the anodes to galvanic baths for final refinement.

(c) All these systems are capital and labor intensive.

(d) They all require significant floor space and energy consumption.

(e) They all require significant safeguards as to dust collection and waste chemical disposal.

Objects and Advantages:

Accordingly several objects and advantages of the present invention are:

(a) to provide a precious metals reclamation apparatus that separates metal runners and contacts from circuit boards and discarded bare board waste without mixing it in with metals to be separated later or pyrolyzing organic materials with inherent hazardous dioxins and furans.

(b) to provide a precious metals reclamation apparatus that utilizes benign, environmentally friendly chemicals for separating copper and nickel and other trace metals from precious metals, leaving only desired metal, such as gold.

(c) to provide a precious metals reclamation apparatus that that utilizes a one step process.

(d) to provide a precious metals reclamation apparatus that has a small footprint and is relatively inexpensive.

(e) to provide a precious metals reclamation apparatus that is not labor intensive to operate.

(f) to provide a precious metals reclamation apparatus that separates precious metals from circuit board scrap rapidly.

Further objects and advantages are to provide a precious metal reclamation apparatus which can be used easily and conveniently by relatively unskilled operators with a high return on investment. Still further objects and advantages will become apparent from a consideration of the ensuing description and drawings.

SUMMARY

In accordance with the present invention, an improved apparatus for reclamation of precious metals from circuit board scrap comprises a peeling mechanism for metal runners and contacts from scrap circuit boards and a leaded glass beaker for containing the metal peelings and a muratic (weak hydrochloric) acid solution which is saturated with copper sulfate; a means for generating an electromagnetic field at specific frequencies and power levels; a skimmer to remove the floating metal flake from the surface of the chemical solution; a means for rinsing the captured metal flake in water and denatured alcohol; a means for compressing the rinsed flake; and a means for melting and pouring into bars or nuggets for further use or sale.

The foregoing and other objects and advantages will appear from the description to follow. Reference is made in the description to the accompanying drawings which form a part hereof. The accompanying drawings show, by way of illustration, two specific embodiments in which the invention is practiced whereby the precious metal reclaimed is gold. These embodiments will be described in sufficient detail to enable those skilled in the art to practice the invention, and it is to be understood that other embodiments may be utilized and that structural changes, process control circuitry modification and automation may be made without departing from the scope of the invention. For example FIG. 1-A shows a cathode drive control circuit as an alternative to the grid drive control circuit shown in FIG. 1 which takes less power but does not give as precise of control over the wave forms generated. The size and shape of the apparatus shown in the attached drawings is for illustrative purpose only and is not intended to limit the application as to scaling that will be obvious to one skilled in the art of metals reclamation. Other embodiments can be utilized to reclaim other precious metals utilizing similar hardware but run at specific power levels and frequencies between 50 kilohertz and 1 megahertz for the desired metals such as silver, platinum, titanium, rhodium and palladium. In the accompanying drawings, like reference characters designate the same or similar parts throughout the several views.

DRAWINGS

Drawing Figures

FIG. 1-A shows a second embodiment with a cathode drive control circuit.

REFERENCE NUMERALS IN DRAWINGS

10—induction furnace
12—heat exchanger
14—non-conductive fluid
16—large inductor
18—v-shaped leaded glass beaker
20—metal level
22—10 cm. long metal segments
24—chemical solution (mild HCL, $H_2O$ & copper sulfate)
26—solution fill level
28—Variac
30—power supply with controls
32—run switch
34—tune switch control circuit
36—push-pull power amplifier
38—oscillator
40—voltage control oscillator
42—run level
44—coolant pump & motor
46—cathode drive control circuit
J1—push-pull power amp. output
J2—oscillator output
J3—voltage control osc. output
J4—power supply output
J5—single phase 220 volt supply
X—output of cathode drive control circuit

DETAILED DESCRIPTION

The present invention springs from the discovery that mild acids could be utilized to shear undesired metals away at a high rate from the desired metal when acid solution and scrap metal segments are excited by application of an electromagnetic field at specific frequencies and power levels based on the end metal desired and the included metals to remove. When acid solutions saturated with copper sulfate are exited, sheared copper and nickel molecules are rapidly absorbed into solution, leaving only desired metal, such as gold, in a 99.5% pure flake which can be skimmed off the surface of the solution or filtered from the solution.

The apparatus to accomplish the reclamation of the desired metals disclosed in this invention works much more quickly, less than sixty minutes from start-up to pure precious metal output, is simpler than prior art apparatus and it generates no hazardous by-products. The output of this apparatus is pure desired metal, not solutions containing the desired metals requiring further process steps to reclaim. Unwanted metal ions are sheared away precisely to the boundary between the desired and undesired metals allowing for a high, approximately 99.5%, purity of desired metal remaining. The shearing acid is completely reusable after the unwanted metal salts are allowed to precipitate out. When the shearing solution has absorbed all the undesired metal it can, it is poured off and new solution added. This cycle is repeated, approximately five times for the present embodiment, until all undesired metal is sheared and absorbed and the remaining precious metal is left in 99.5% pure flake. The apparatus can be monitored either by watching the color of the shearing fluid change from aqua to purple as the fluid saturates or by monitoring the reflected energy with a simple voltmeter. Metal runners 22 are typically 70% copper, 10% nickel, 10% gold and 10% other metals. The older the boards, the higher the % of gold will be.

Figure 1:
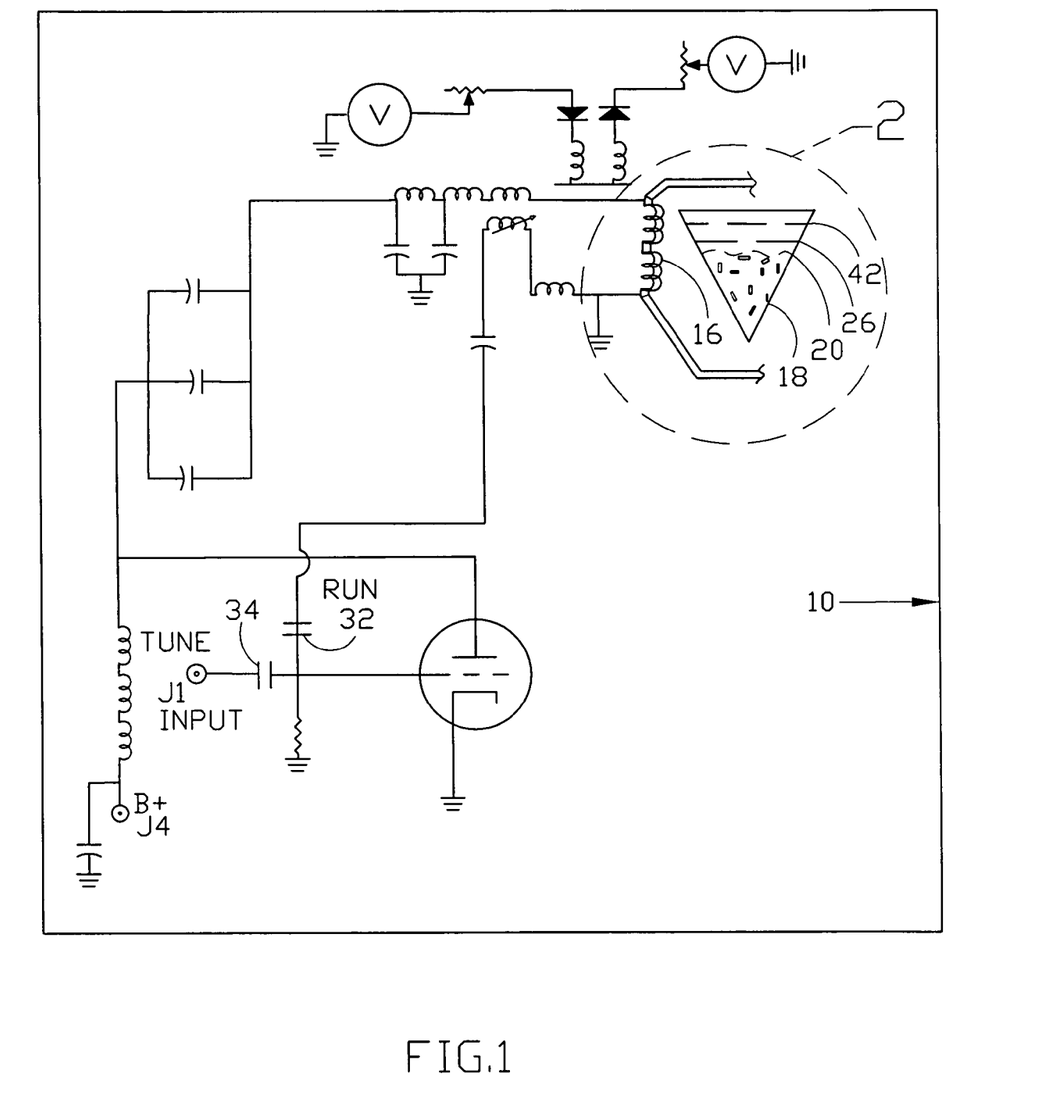
FIG. 1 shows a schematic of a two kilowatt induction furnace with a grid drive control circuit for generating an electromagnetic field required to excite metal atoms and chemical ions and a v-shaped leaded glass beaker to hold the metal shavings and chemicals during processing.

Turning to the drawings for a more thorough explanation of the apparatus, FIG. 1 shows modified induction furnace 10 (approximately 2 KW capacity) with grid drive control circuit and with a v-shaped leaded glass beaker 18 adjacent to large inductor 16. FIG. 1A shows a similar induction furnace 10, but is modified with a cathode drive control circuit. 46.

Figure 2:
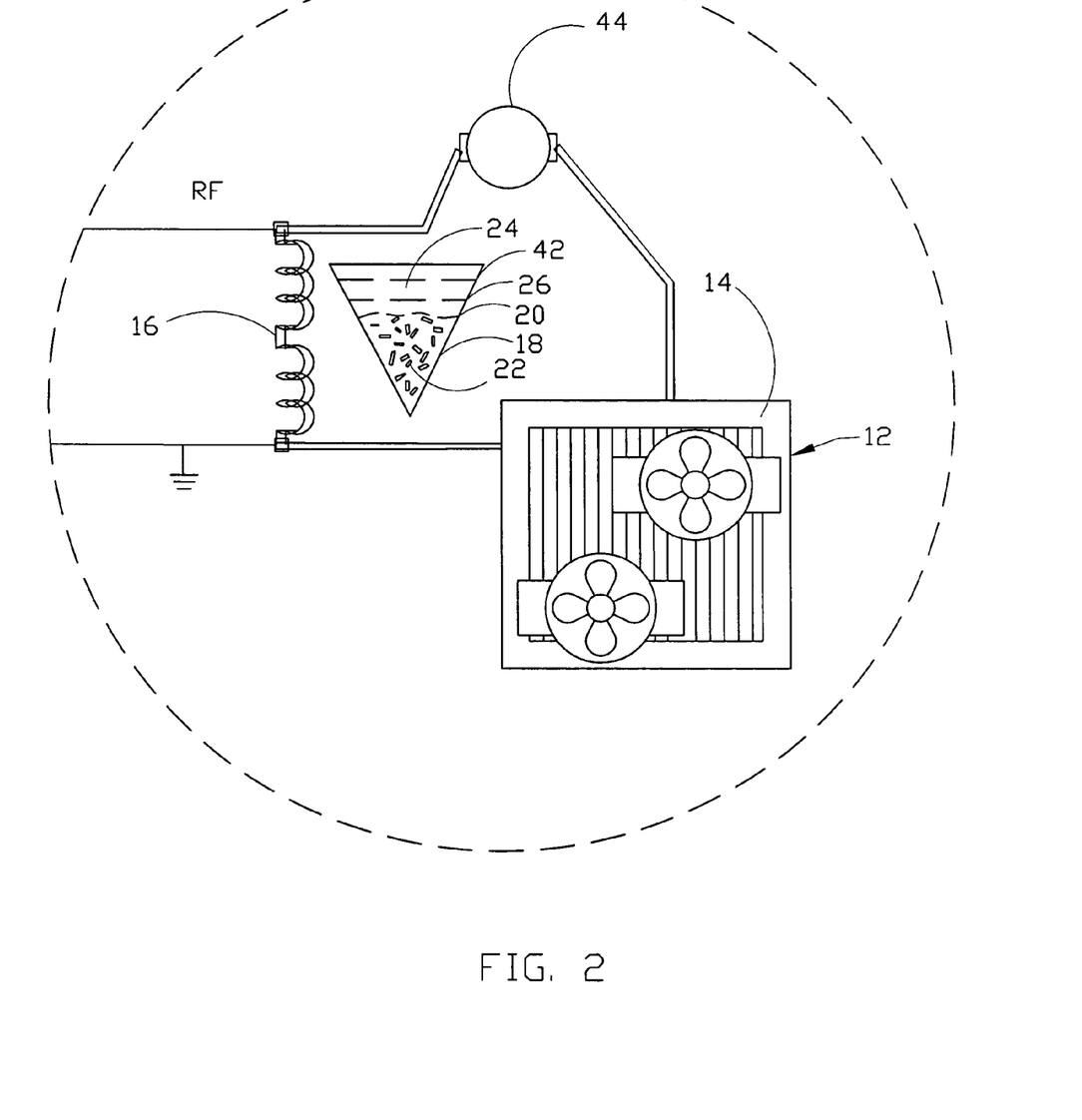
FIG. 2 shows a nonconductive-fluid based heat exchanger.

FIG. 2 is an enlarged partial view of beaker 18 adjacent to large inductor 16 with non-conductive fluid 14 being circulated through large inductor 16 by pump 44 and then through heat exchanger 12 and back again to large inductor 16. This view also shows beaker 18 with metal segments 22 loaded in beaker 18 up to metal level 20 and chemical solution 24 filled up to solution fill level 26. Chemical solution 24 is preferably muratic acid, water and copper sulfate with an approximate ratio of 2/3 water and 1/3 muratic acid (weak HCL) and 1 pound of copper sulfate per gallon of solution.

Figure 5:
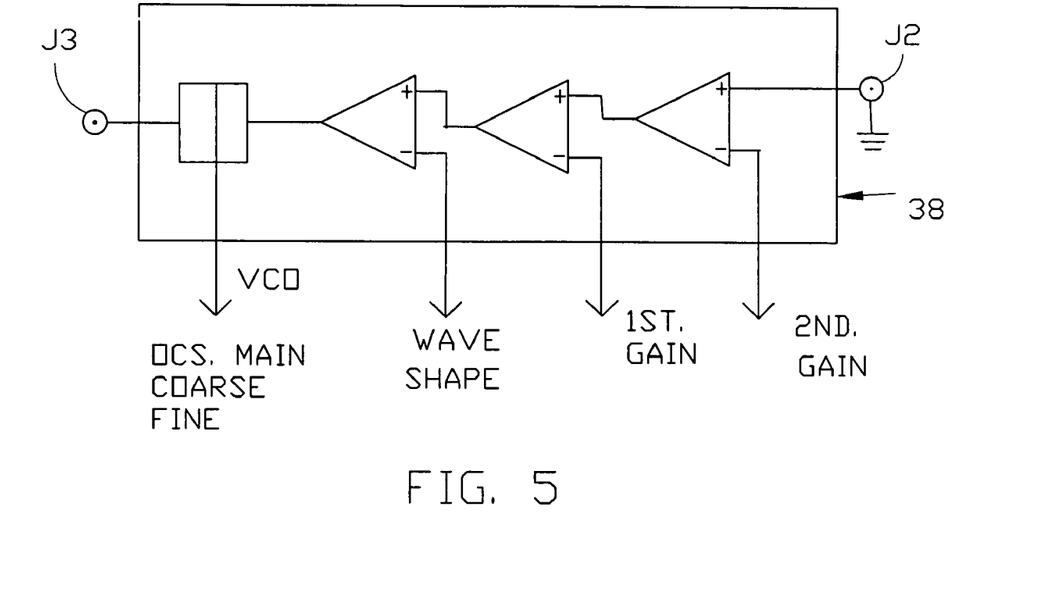
FIG. 5 shows an oscillator.

An electromagnetic field is applied to beaker 18 by induction furnace 10 by stepping power from 0 to 400 watts with controlled sine wave oscillator 38 set at approximately 13 KHZ as shown in FIG. 5.

Heat exchanger 12 controls the temperature of non-conductive fluid 14, as shown in FIG. 2. Control of the temperature of chemical solution 24 at approximately 25 degrees centigrade, allows the expansion of chemical solution 24 to run level 42 and the frequency to increase to approximately 30 KHZ.

At these settings the copper molecules are sheared very quickly from the nickel or zinc layer and then the nickel or zinc layer from the gold plating. Iron and tin can be sheared by tuning the frequency of sine wave oscillator 38 to between 7 and 13 kHz. More complex metals such as silver, platinum, palladium, rhodium and titanium can be sheared by tuning the frequency of sine wave oscillator 38 to between 50 kilohertz and 1 MHz.

As noted above, the process for gold reclamation ideally is started with of sine wave oscillator 38 set at 13 kHz where the reflected energy is about 5 to 1. As oscillator 38 ramps up to 30 kHz, the reflected energy drops to about 1 to 1 as metal segments 22 are absorbing all the power and aqua colored chemical solution 24 around metal segments 22 turns purple. Chemical solution 24 has absorbed all the copper, nickel and other metals that it can at that point and used chemical solution 24 is poured off and fresh chemical solution 24 is added to beaker 18. The cycle is repeated two to five times, until chemical solution 24 maintains its aqua color throughout the cycle, finding no more copper, nickel or other metals. The pure gold flake which has floated to the surface of chemical solution 24 can then be readily filtered or skimmed off the surface. The gold flake can then be rinsed in water and denatured alcohol, compressed, melted and poured into bars or nuggets for later use or sale.

Basically there are no hazardous waste byproducts of this apparatus. The used chemical solution 24 is stored in any commercially available container designed for handling weak acids, for approximately two weeks. The copper, nickel and other metal salts precipitate out as sludge in the bottom of the container in a stratified manner and chemical solution 24 returns to its original aqua color, indicating that it is ready for reuse.

If there is an interest in recovering the other metals from the remaining sludge, they can be refined by melting and using the unique melting points of the various metals, separated through wet chemical and/or electrolytic processes or by taking advantage of the differences in specific gravities effecting the precipitation rates indicated by the stratification in the sludge of different metals.

An example of an embodiment that demonstrates this invention for gold reclamation is described as follows: a small, approximately 2 kilowatt, induction furnace 10 as shown in FIG. 1 is modified by adding a heat exchanger 12 as shown in FIG. 2 which circulates a non-conductive fluid 14, such as Glycol, with an electric motor and pump assembly 44 through large inductor 16, adjacent to conical shaped leaded glass beaker 18.

Figure 3:
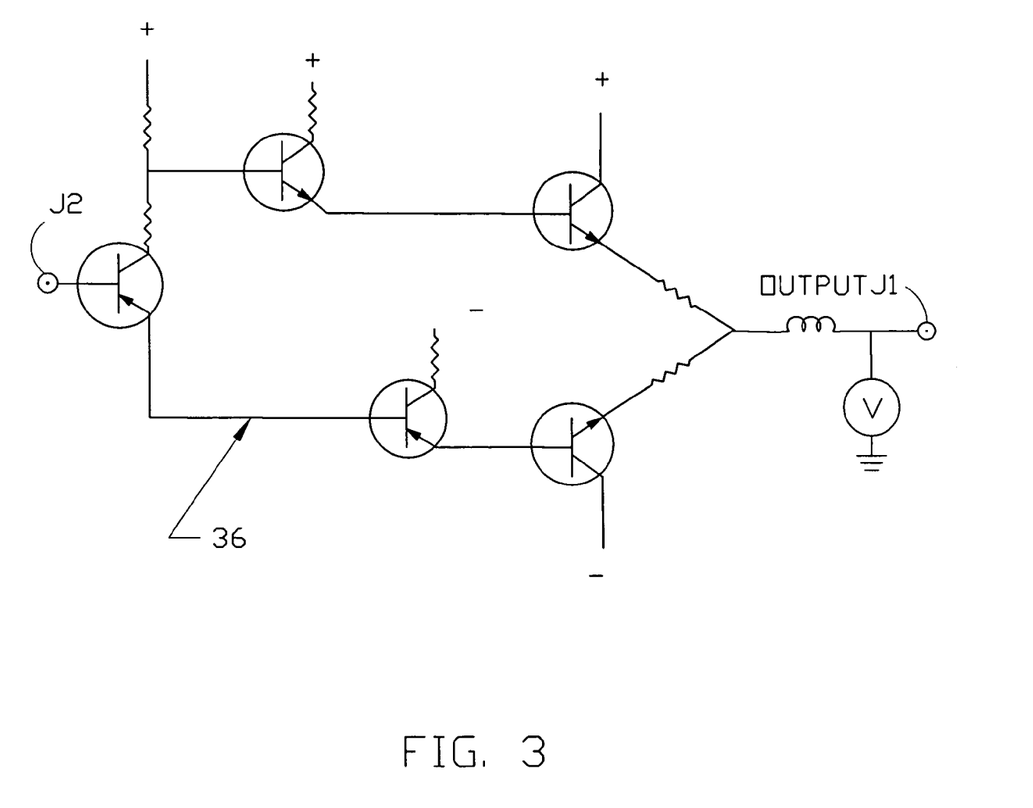
FIG. 3 shows a schematic of a push-pull power amplifier.
Figure 4:
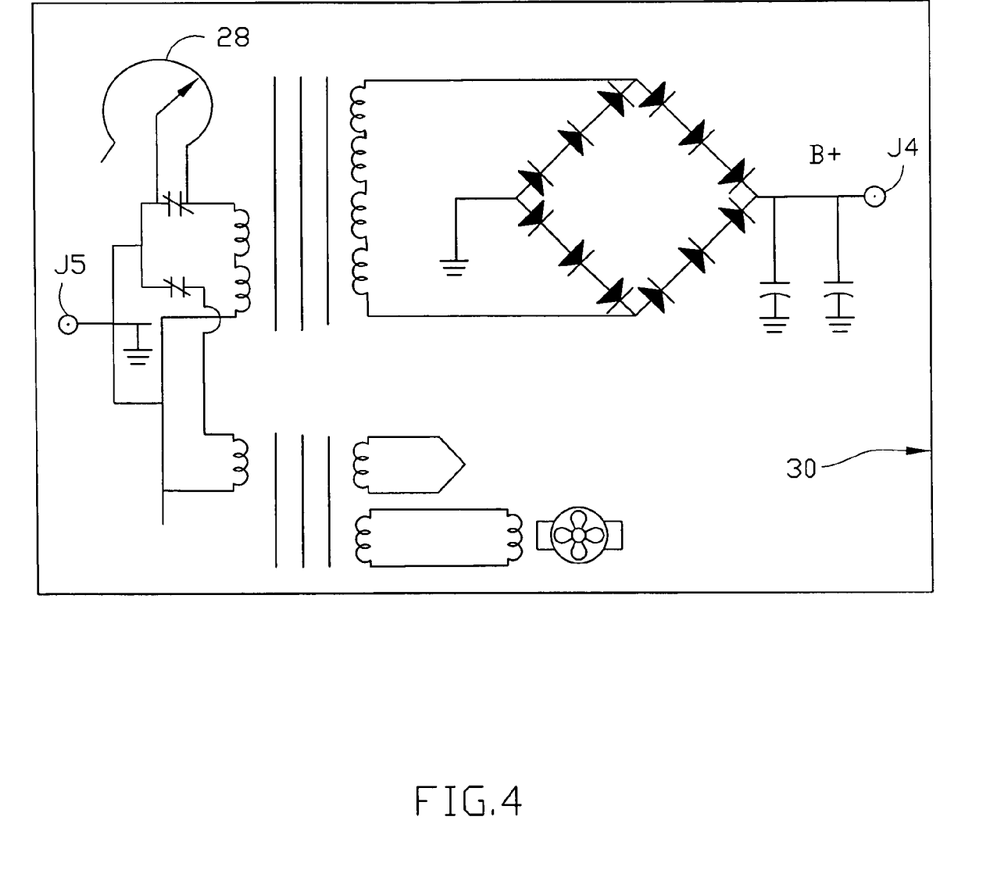
FIG. 4 shows a schematic of a power supply with controls.
Figure 6:
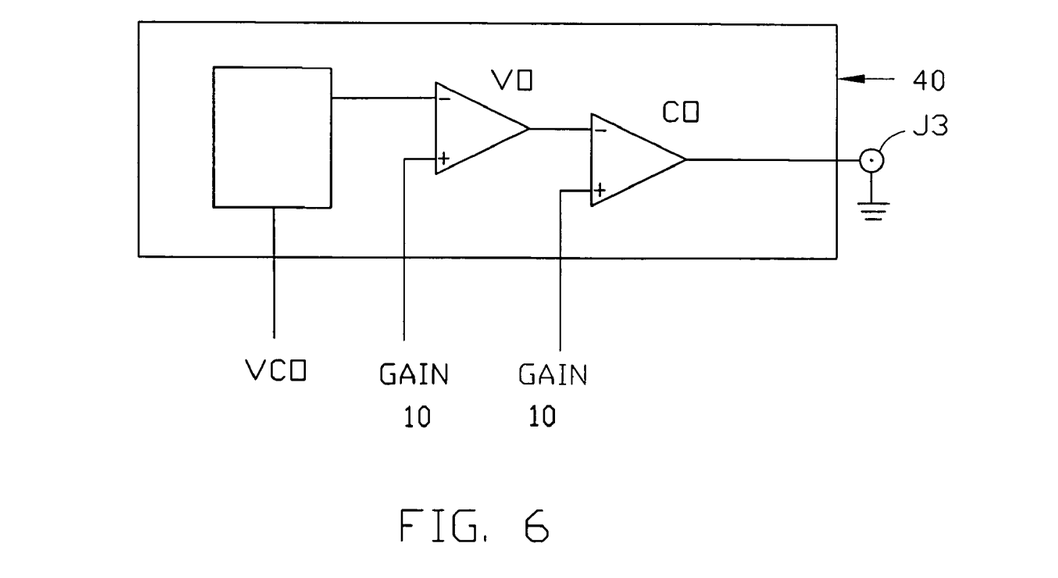
FIG. 6 shows a voltage control oscillator

Induction furnace 10 is also modified by adding wave shaping, frequency control and voltage control by connecting push-pull power amplifier 36 as shown in FIG. 3 at J1 by closing tune switch 34 and opening run switch 32 as shown in FIG. 1. Oscillator 38 which is shown in FIG. 5 is connected at J2 to amplifier 36 and voltage control oscillator 40, shown in FIG. 6, is connected to oscillator 38 at J3. For a specific desired metal output, such as gold, induction furnace 10 is tuned using power amplifier subassemblies 36, 38 and 40 shown in FIGS. 3, 5 and 6 to produce a 13 kHz sine wave. Once the desired wave shape and frequency is set, tuning switch 34 is opened and run switch 32 is again closed. A single phase 220 volt supply is then applied at J5 to the power supply circuit 30 shown in FIG. 4 which connects to induction furnace 10 at J4, shown in FIG. 1, started at zero and slowly ramped up to 400 watts using Variac control 28.

Beaker 18 is loaded to metal level 20, shown in FIG. 2, approximately ⅔ full, with scrap metal segments, which have been peeled from the circuit boards and chopped into approximately 10 centimeter long chunks 22. Chemical solution 24, which is a mild HCL, preferably muratic acid, and water with an approximate ratio of 1/3 muratic acid and 2/3 water that has been saturated with copper sulfate is then added to beaker 18 to fill level 26, shown in FIG. 2. As chemical solution 24 heats up to approximately 25 degrees centigrade and expands to run level 42, shown in FIG. 2, the frequency will raise to approximately 30 kHz., reflected energy drops from 5 to 1 down to 1 to 1 and the copper molecules are sheared very rapidly and the nickel or zinc ions are sheared away from the gold plating. It is important to avoid driving the RF source into a square wave as square waves make the process unstable. Sine waves are ideal for this process. As the copper and nickel molecules are sheared from the gold surface and absorbed by chemical solution 24, chemical solution 24 changes color from its natural aqua to a dark purple in approximately two minutes. At this point beaker 18 is removed from the induction furnace 10 and the used chemical solution 24 is poured off to a precipitation tank, not part of this invention. Fresh chemical solution 24 is added to beaker 18, beaker 18 is reintroduced to induction furnace 10 and the field is reapplied. This process is repeated two to five times until chemical solution 24 maintains its original color throughout the cycle. At that point the remaining metal, in this case gold, flake will float to the surface of beaker 18 and can be skimmed off or strained from chemical solution 24, rinsed in water and denatured alcohol, compressed and melted into bars or nuggets as 99.5% pure gold.

An alternative embodiment that demonstrates this invention for gold reclamation is described as follows: a small, 2 kilowatt induction furnace 10 as shown in FIG. 1A, is modified as the embodiment shown in FIG. 1 except in addition to the grid drive control circuit shown there, this embodiment adds a cathode drive control circuit 46 which is switched in at interconnect point X shown in FIG. 1A to provide more precise wave form shaping. Even though this drive scheme requires much higher power it generates an almost perfect wave form with no distortion or clipping and allows the shearing process to progress at a very rapid rate.

What is claimed is:

1. An installation for the reclamation of precious metals plated onto circuit board runners and contacts comprising:
   a) an induction furnace which is modified by adding a heat exchanger, which circulates a non-conductive fluid with an electric motor and pump assembly through a large inductor adjacent to a nest for a removable v shaped leaded glass beaker and then through said heat exchanger;
   b) said induction furnace is further modified by adding wave shaping, frequency control and voltage control through a drive control circuit to standard induction furnace controls; and
   c) said v shaped leaded glass beaker.

2. An installation for the reclamation of precious metals plated onto circuit board runners and contacts as defined in claim 1 where said drive control circuit is selected from a group comprised of:

a) a grid drive control circuit and
b) a cathode drive control circuit
whereby said grid drive control circuit requires less power than said cathode drive control circuit, but said cathode drive control circuit generates a more stable, perfect output wave with no distortion or clipping and, although said cathode control drive circuit requires more power than said grid drive control circuit, said cathode drive control circuit significantly reduces shearing process time.

* * * * *